(12) United States Patent
Buonassisi et al.

(10) Patent No.: US 8,450,704 B2
(45) Date of Patent: May 28, 2013

(54) PHONON-ENHANCED CRYSTAL GROWTH AND LATTICE HEALING

(75) Inventors: Anthony Buonassisi, Cambridge, MA (US); Mariana Bertoni, Medford, MA (US); Bonna Newman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/959,795

(22) Filed: Dec. 3, 2010

(65) Prior Publication Data

US 2011/0136348 A1 Jun. 9, 2011

Related U.S. Application Data

(60) Provisional application No. 61/266,677, filed on Dec. 4, 2009.

(51) Int. Cl.
*A61N 5/00* (2006.01)
(52) U.S. Cl.
USPC ............... 250/492.1; 250/492.2; 438/795; 438/796
(58) Field of Classification Search
CPC .... H01L 21/26; H01L 21/2605; H01L 21/2636
USPC ......... 438/308, 378, 795, 796; 257/E21.125; 250/492.1, 492.2, 493.1, 494.1
See application file for complete search history.

(56) References Cited

U.S. PATENT DOCUMENTS

| | | | |
|---|---|---|---|
| 4,668,331 A | 5/1987 | Ostriker | |
| 5,724,138 A * | 3/1998 | Reich et al. | 356/492 |
| 5,900,935 A * | 5/1999 | Klein et al. | 356/502 |
| 5,917,195 A | 6/1999 | Brown | |
| 5,997,659 A | 12/1999 | Liansky et al. | |
| 6,020,988 A * | 2/2000 | Deliwala et al. | 359/276 |
| 6,086,671 A | 7/2000 | Kawanishi et al. | |
| 6,506,250 B1 | 1/2003 | Breitenstein et al. | |
| 6,896,732 B2 | 5/2005 | Fickett et al. | |
| 7,344,598 B2 | 3/2008 | Lan et al. | |
| 2003/0039866 A1* | 2/2003 | Mitamura | 428/698 |
| 2005/0028729 A1 | 2/2005 | Jung | |
| 2005/0242066 A1* | 11/2005 | Statnikov | 219/76.13 |
| 2007/0141817 A1 | 6/2007 | Lojek et al. | |
| 2009/0122940 A1 | 5/2009 | Breed | |
| 2009/0206324 A1* | 8/2009 | Hudait et al. | 257/14 |

FOREIGN PATENT DOCUMENTS

JP 2001338894 12/2001

OTHER PUBLICATIONS

Hikata et al., "Dislocation Interactions with Phonons in Sodium Chloride in the Temperature Range 70-300K" Physical Review B, vol. 6, No. 10, Nov. 15, 1972, pp. 4008-4013.
Scholten et al., "Decay of high-frequency phonons in amorphous silicon" Physical Review B, vol. 53, No. 7, Feb. 15, 1996, pp. 3837-3840.

(Continued)

*Primary Examiner* — Khiem D Nguyen
(74) *Attorney, Agent, or Firm* — Gesmer Updegrove LLP

(57) ABSTRACT

A system for modifying dislocation distributions in semiconductor materials is provided. The system includes one or more vibrational sources for producing at least one excitation of vibrational mode having phonon frequencies so as to enhance dislocation motion through a crystal lattice.

18 Claims, 4 Drawing Sheets

OTHER PUBLICATIONS

Okuda et al., "New Aspects of Crystal Growth of Solid 4He Studied by Acoustic Wave" Journal of the Physical Society of Japan, vol. 77, No. 11, Nov. 2008, pp. 111009-1-111009-10.

Kuleev et al., "The Mechanism of Landau-Rumer Relaxation Thermal and High-Frequency Phonons in Cubic Crystals of Germanium, Silicon and Diamond" Journal of Experimental and Theoretical Physics, vol. 99, No. 1, 2004, pp. 109-120.

Feng-Quan et al., "The influence of vibration & shock on the crystal growth during solidification" Journal of Materials Science 2000, pp. 1907-1910.

Shen et al., "Utilizing vibration to promote microstructural homogeneity during floating-zone crystal growth processing" Journal of Crystal Growth, 165, 1996, pp. 438-446.

International Search Report issued on Jul. 29, 2011 for PCT/US2010/058869.

Sheinkman, M.K. "Ultrasound Treatment as a New Way for Defect Engineering in Semiconductor Materials and Devices," Oct. 1998. vol. 1, pp. 183-192.

\* cited by examiner

| Si Phonon Modes (symmetry) | Frequencies (1x10$^{12}$ Hz) | Wavelength (μm) |
|---|---|---|
| $\nu_{LTO}(\Gamma_{25'})$ | 15.5 | 19.3 |
| $\nu_{TA}(X_3)$ | 4.5 | 66.6 |
| $\nu_{LAO}(X_1)$ | 12.3 | 24.4 |
| $\nu_{TO}(X_4)$ | 13.9 | 21.6 |
| $\nu_{TA}(L_3)$ | 3.45 | 86.9 |
| $\nu_{LA}(L_2')$ | 11.3 | 26.5 |
| $\nu_{LO}(L_1)$ | 12.6 | 23.8 |
| $\nu_{TO}(L_3')$ | 14.7 | 20.4 |

FIG. 3

| Wave propagation Direction | Wave character | Expression for wave speed | Wave speed (in units of $10^5$ cm/s) |
|---|---|---|---|
| [100] | $V_L$ | $(C_{11}/\rho)^{1/2}$ | 8.43 |
| | $V_T$ | $(C_{44}/\rho)^{1/2}$ | 5.84 |
| [100] | $V_l$ | $[(C_{11}+C_{12}+2C_{44})/2\rho]^{1/2}$ | 9.13 |
| | $V_{t\parallel}$ | $V_{t\parallel}=V_T=(C_{44}/\rho)^{1/2}$ | 5.84 |
| | $V_{t\perp}$ | $[(C_{11}-C_{12})/2\rho]^{1/2}$ | 4.67 |
| [111] | $V_l$ | $[(C_{11}+2C_{12}+4C_{44})/3\rho]^{1/2}$ | 9.36 |
| | $V_t$ | $[(C_{11}-C_{12}+C_{44})/3\rho]^{1/2}$ | 5.10 |

PHONON-ENHANCED CRYSTAL GROWTH AND LATTICE HEALING

PRIORITY INFORMATION

This application claims priority from provisional application Ser. No. 61/266,677 filed Dec. 4, 2009, which is incorporated herein by reference in its entirety.

GOVERNMENT SPONSORSHIP INFORMATION

This invention was made with Government support under Grant No. DE-FG36-09GO19001, awarded by the Department of Energy. The Government has certain rights in this invention.

BACKGROUND OF THE INVENTION

The invention is in the field of production of crystalline materials, and in particular to phonon-enhanced crystal growth and lattice healing.

Modern semiconductor technology demands high-quality crystalline solids for high-performance and high-efficiency devices. In the case of solar cells (PV, photovoltaic), where the materials quality demands are less stringent, half of the industry has adopted a multicrystalline silicon (mc-Si) based technology. While manufacturing costs of mc-Si are lower than single-crystalline silicon, the efficiencies achievable with mc-Si materials are also significantly lower. The principal performance limitation of mc-Si lies in its high defect content. Dislocations, grain boundaries and impurities are the principal causes of carrier recombination and lifetime losses. The majority of these defects arise from the use of a less pure silicon feedstock source and a less sophisticated crystal growth technique.

During the growth of silicon crystals, the thermal characteristics of the growing system are the most important consideration. The morphology, crystal quality, and impurity content are determined by the nature of the heat flow balance around the melt-crystal interfaces.

In the case of ribbon or foil mc-Si, the crystal cools by radiation and gas convection at the crystal surface, while the melt radial temperature gradient is determined by the melt aspect ratio and heater geometry. In the case of ingot mc-Si, the crystal cools by conduction through the crucible walls, as well as radiatively and convectively via the top surface.

The interface shape and isotherms in the growing crystal are controlled by the melt temperature gradients and the crystal cooling conditions as well as the crystallization rates.

These configurations correspond to high thermal stress conditions, which can generate dislocations and small-angle grain boundaries when the thermal stress exceeds the critical resolved shear stress.

Specifically, structural defects like dislocations play an important role in lifetime degradation since they act as centers for recombination of charge carriers (electrons, holes). It is known that a dislocation density decrease from $10^6$ cm$^{-2}$ to $10^4$ cm$^{-2}$ results in a lifetime increase of 70%. Likewise, the reduction of dislocation densities in mc-Si from $10^7$ cm$^{-2}$ (found in as-grown wafers) to <$10^4$ cm$^{-2}$ can potentially increase photovoltaic efficiencies on the order of 10-20% relative. While this is especially promising in photovoltaics, where mc-Si is the major starting material, removal of dislocations with low manufacturing cost would have a tremendous impact in other industries such as semiconductor device processing.

It has been shown that high temperatures and stresses enhance dislocation motion and help alleviate the crystallographic defects found in different sources of mc-Si (e.g. string-ribbon, ingot mc-Si). Previous studies also show that by applying mechanical loads and high temperature to solid blocks/bricks and wafers of multicrystalline silicon, dislocation densities can be reduced.

SUMMARY OF THE INVENTION

According to one aspect of the invention, there is provided a system for modifying dislocation distributions in semiconductor materials. The system includes one or more vibrational sources for producing at least one excitation of vibrational mode having phonon frequencies so as to enhance dislocation motion through a crystal lattice.

According to another aspect of the invention, there is provided a method of modifying dislocation distributions in semiconductor materials. The method includes providing one or more vibrational sources. Also, the method includes producing at least one excitation of vibrational mode using the one or more vibrational sources. The at least one excitation of vibrational mode includes phonon frequencies so as to enhance dislocation motion through a crystal lattice.

BRIEF DESCRIPTION OF THE DRAWINGS

FIG. 3 is a table illustrating the properties of Si phonons formed in accordance with the invention; and FIG. 4 is a table illustrating the properties of acoustical phonons formed in accordance with the invention.

DETAILED DESCRIPTION OF THE INVENTION

The invention involves a technique to modifying dislocation distributions in crystalline material during crystal growth or after crystal growth. The invention is based in the idea that excitations at particular phonon modes can effectively enhance dislocation annihilation, for example, by promoting dislocations of different signs to move and find each other for pair-wise annihilation. The invention can also be applied as a technique that aids in the reduction of dislocation densities in a crystal lattice.

In particular, the invention proposes to engineer phonon excitation in materials to facilitate lattice healing and consequently decrease the density of dislocations. Excitation and propagation of phonons through the lattice with specific directions and speeds would allow the creation of spatially and temporally varying electrostatic, chemical, thermal, and mechanical gradients which could drive defects such as impurities and dislocations out of the bulk crystal.

Figure 1:
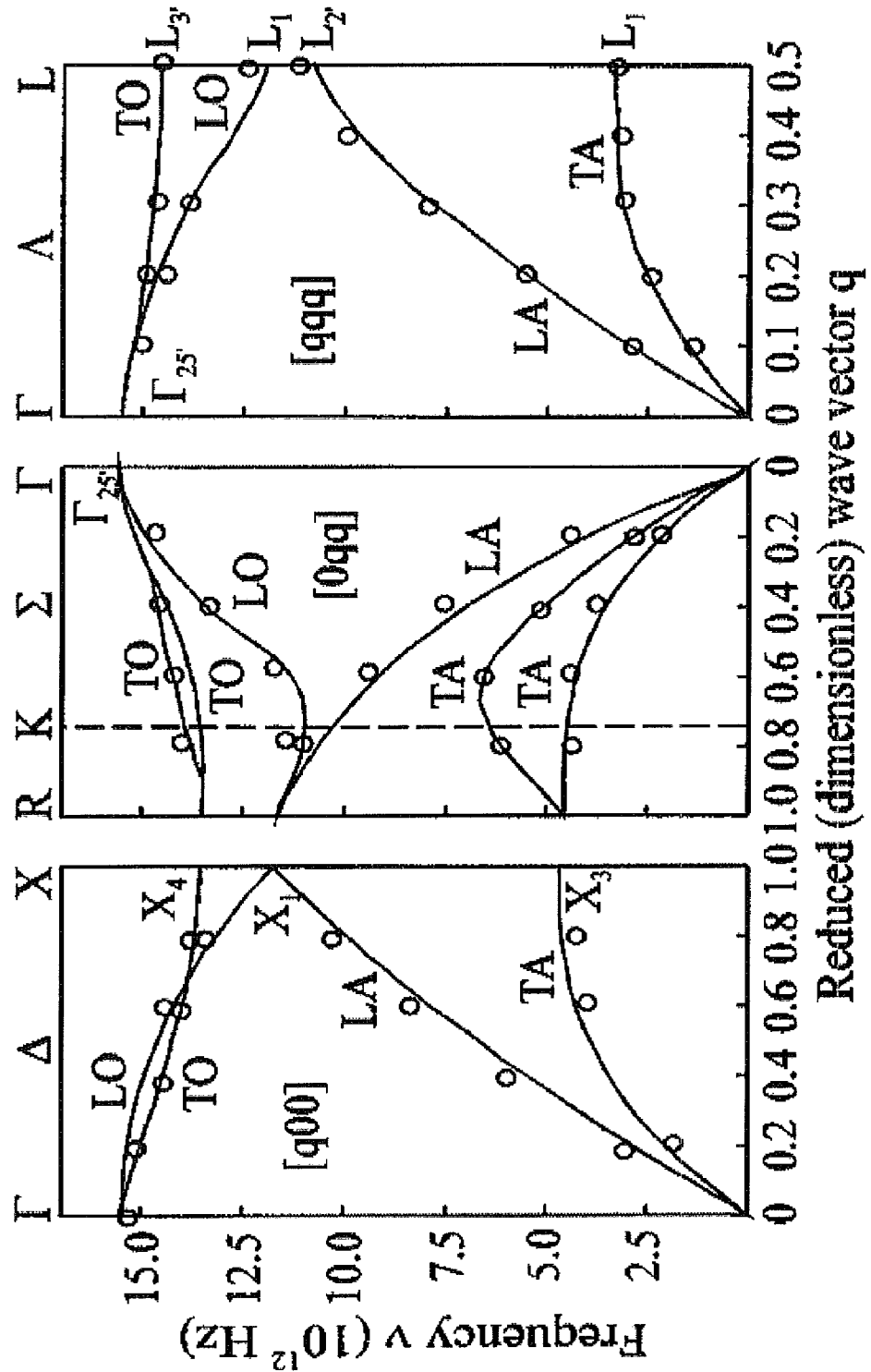
FIG. 1 is a graph illustrating the relation between phonon frequency and reduced wave vector q.

Phonons are quantum of vibrational modes in rigid crystal lattices. They are responsible for many electronic and thermal properties of a material (e.g. thermal conductivity, elastic modulus). Phonons move through a lattice as waves but also have the characteristics of a quantum mechanical particle. Because of the wave-particle duality, phonons are usually described in terms of their frequency (f) and wavenumber (k), as shown in FIG. 1.

For most semiconductor materials, three types of phonons exist; acoustic, optical and thermal. Acoustic and optical phonons correspond to specific vibrational modes of the lattice atoms. These phonons have well-described frequencies and wavelengths. These phonons travel with known group velocity determined by the dispersion relation df/dk, where f is the frequency and k is the wavenumber. These phonons move along specific crystal axes undampened. Acoustic phonons have longer wavelength with lower frequency and correspond to sound waves propagating through the lattice. Optical phonons have longer wavelength with higher frequencies and are easily excited by light (e.g. infrared absorption and Raman scattering). Thermal phonons are random vibrations of the atoms in the lattice, which have no resonant modes.

Current research suggests that thermal phonons can provide the necessary energy to change dislocation velocity and move them through the crystal lattice to locations where they can be annihilated or removed. This invention entails the use of resonance phonons with controllable modes and frequencies to move dislocations in specific directions with specific speeds. This invention also details techniques to create thermal phonons so as to transfer energy to dislocations, increasing their ability to move through the lattice. External sources of low frequency phonon excitations would optimize the growth or healing of crystal structures and drive out defects.

Figure 2:
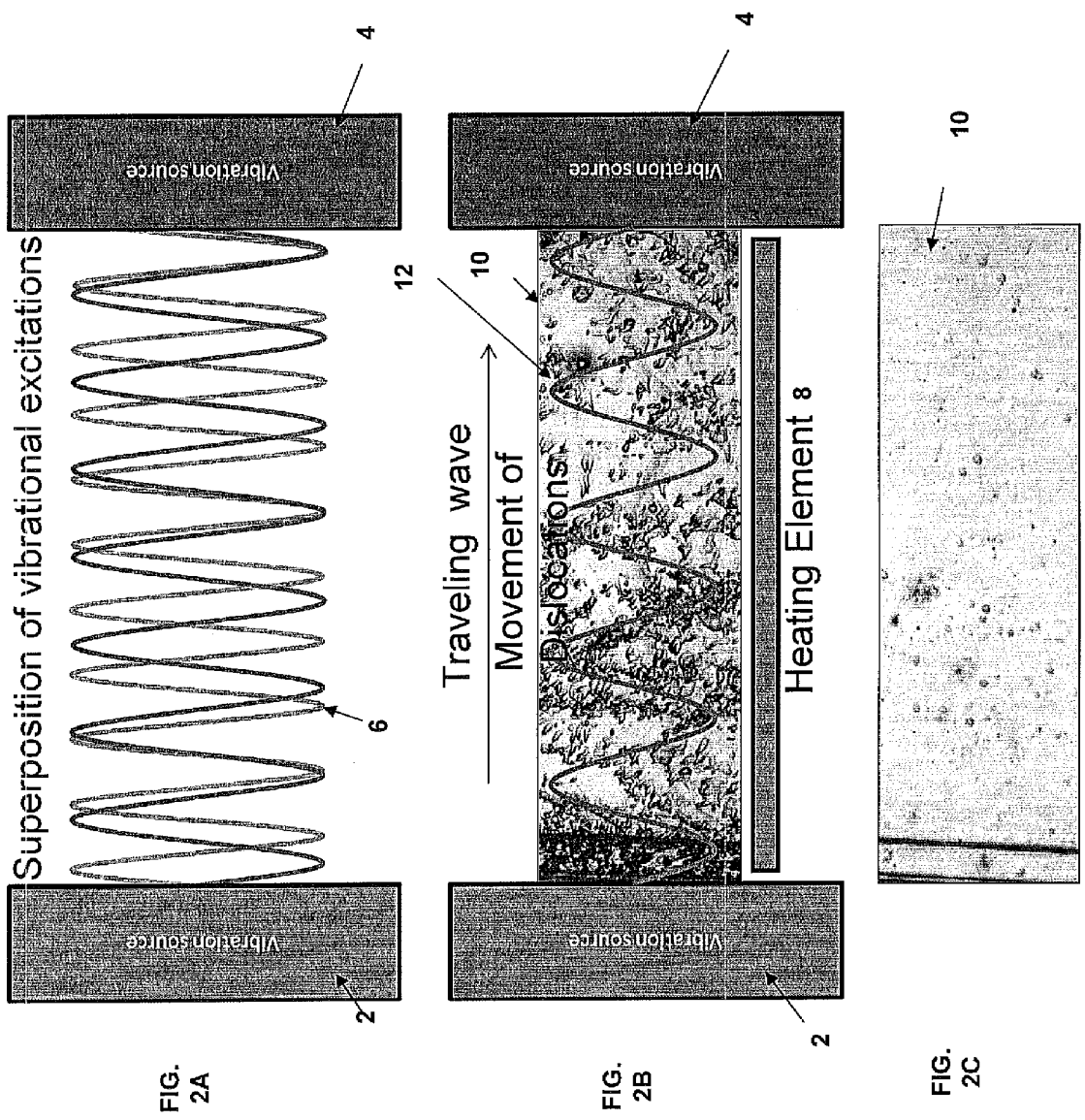
FIGS. 2A-2C are schematic diagrams and a SEM diagram illustrating the arrangement and performance of the invention.

FIG. 2A-2C show schematic diagrams illustrating the invention. FIG. 2A shows vibrations sources 2 and 4 to produce the superposition of the vibrational excitations 6. The invention can include excitation of vibrational modes 6 coupled into a sample from opposite directions, as shown in FIG. 2A, along either a transverse or longitudinal axis. The resulting superposition of the vibrational waves, shown in FIG. 2B would result in a traveling wave front 12 which would act to create areas of cyclic stress inside the sample 10. Application of heat, as produced by the heating elements 8, would enhance the movement of dislocations along the direction of the engineered wave and drive dislocations from the sample 10. FIG. 2C illustrates the movement or in some cases the removal of the dislocation as show in the material 10.

FIG. 3 illustrates a table showing the relationship between various Si phonon modes and the respective frequencies and wavelength produced by optical phonons. These modes can be used to form various phonon excitations to form a traveling wave that can operate efficiently in a Si material sample for moving dislocation. In other materials systems the mode, frequencies and wavelengths can be different but the idea is the same, movement of dislocation can be obtained by producing traveling waves having a number of phonon excitations.

FIG. 4 illustrates a table showing the relationship between various phonon modes wave propagation in a lattice, wave character, expression of wave speed, and the actual wave speed produced by acoustical phonons. Instead of heating a sample to temperatures above 1100 C, one could couple energy into a resonant channel.

The invention reduces dislocation density in semiconductor materials by exciting phonon frequencies to enhance dislocation motion through the lattice. The invention can operate in heated-environments, room temperature, or low-temperature environments. The samples used in accordance with can have specimens with deposited diffusion barriers or specimens with no diffusion barriers. The phonon excitations can be time dependent or time independent. Optical excitations can be formed from a laser or other coherent photon source, such electron beams. Acoustic excitations can be formed from sound waves or pressure waves created by pulsed contact with the material. Low-energy excitation can be generated by thermal gradients, thermal pulses and temperature variations. Also, acoustic and/or optical excitations can include pulses, an oscillating electric field, a constant electric field, or a combination thereof.

The invention can be performed using sub-bandgap light that is absorbed preferentially at dislocations. The invention can be performed by using electromagnetic energy, such as light, that can inject electron hole pairs, which upon recombination release energy in the form of phonons, which can be utilized by nearby dislocations to enhance its diffusion.

The invention can be applied to bulk semiconductor materials during the growth process specifically right after the melt, where the temperatures are in the appropriate range. In addition, the invention can be applied to silicon growth by (a) pulled string ribbon growth, (b) edge-defined-film-fed growth (EFG), (c) ingot directional solidification from a melt, (d) horizontal ribbon or wafer growth, or (e) Float zone and Czochralski type growth.

Bulk semiconductor materials can be used in accordance with the invention to form ingot or bricks before wafering or cutting. Wafers and ribbon comprising bulk semiconductor materials can be produced using the invention. The invention can also be applied in producing thin film semiconductor materials during deposition on crystalline or amorphous substrates.

Also, the strings used in string ribbon silicon growth can be used to apply the necessary vibrations for excitation of phonons using the invention. External waves can be engineered to come from different directions to create regions of traveling waves, creating temporal and spatial cycling inside the lattice on the atomic level. The external waves are created to move dislocations to overlapping locations where recombination and annihilation occur or to the surface of the material. Also, external waves can create phonon excitations in various planes at the same time, causing dislocation movement through different lattice orientations. The phonons drive dislocations to the surface of the material.

The external excitations can be specifically engineered with phase, frequency, wavelength, shape, velocity, group velocity, phase velocity, polarization (transverse and longitudinal), and interference patterns of multiple excitations to gain specific dislocation movement. The source of external excitations can be a single source such as a speaker playing specific tones with variable frequencies, amplitudes, duration, and shapes.

Multiple external sources can be made to excite complex interference patterns of either standing waves, traveling waves, or more complex waves through the material. These external excitations can create phonons without causing damage to surrounding crystal structure. In addition, the phonons can be created for the purpose of annihilating dislocations, without causing a larger number of new dislocations to form in the material.

Although the present invention has been shown and described with respect to several preferred embodiments thereof, various changes, omissions and additions to the form and detail thereof, may be made therein, without departing from the spirit and scope of the invention.

What is claimed is:

1. A system for modifying dislocation distributions in semiconductor materials comprising:
   a crystal lattice;
   at least two vibrational sources for producing a superposition of a plurality of excitations of a vibrational mode from opposite directions having phonon frequencies using sub-bandgap light that is absorbed preferentially at a dislocation so as to enhance dislocation motion through said crystal lattice, sound waves or pressure waves are created by pulsed contact with said semiconductor materials.

2. The system of claim 1 further comprising a heating element to further enhance the dislocation motion through the crystal lattice.

3. The system of claim 1, wherein at least one excitation of said vibrational mode comprises acoustical, thermal, or optical modes.

4. The system of claim 1, wherein at least one excitation of said vibrational mode produces a traveling wave front which acts to create areas of cyclic stress inside the crystal lattice.

5. The system of claim 1, wherein said at least two vibrational sources comprise a laser or other coherent photon source.

6. The system of claim 1, wherein said at least two vibrational sources produce sound waves or pressure waves created by coupling with the semiconductor materials.

7. The system of claim 1, wherein said at least two vibrational sources produce thermal gradients, thermal pulses and temperature variations.

8. The system of claim 1, wherein said at least two vibrational sources comprises pulses, an oscillating electric field, a constant electric field, or a combination thereof.

9. The system of claim 1, wherein at least one excitation of said vibrational mode is created to move dislocations to overlapping locations where recombination and annihilation occur or a surface so as to create reduction in dislocation densities.

10. A method of modifying dislocation distributions in semiconductor materials comprising:
providing at least two vibrational sources;
producing a superposition of a plurality of excitations of a vibrational mode from opposite directions using the said at least two vibrational sources, at least one excitation of said vibrational mode having phonon frequencies using sub-bandgap light that is absorbed preferentially at a dislocation so as to enhance dislocation motion through a crystal lattice, sound waves or pressure waves are created by pulsed contact with said semiconductor materials.

11. The method of claim 10 further comprising a heating element to further enhance the dislocation motion through the crystal lattice.

12. The method of claim 10, wherein at least one excitation of said vibrational mode comprises acoustical, thermal, or optical modes.

13. The method of claim 10, wherein at least one excitation of said vibrational mode produces a traveling wave front which acts to create areas of cyclic stress inside the crystal lattice.

14. The method of claim 10, wherein said at least two vibrational sources comprise a laser or other coherent photon source.

15. The method of claim 10, wherein said at least two vibrational sources produce sound waves or pressure waves created by coupling with the semiconductor materials.

16. The method of claim 10, wherein said at least two vibrational sources produce thermal gradients, thermal pulses and temperature variations.

17. The method of claim 10, wherein said at least two vibrational sources comprises pulses, an oscillating electric field, a constant electric field, or a combination thereof.

18. The method of claim 10, wherein at least one excitation of said vibrational mode is created to move dislocations to overlapping locations where recombination and annihilation occur or a surface so as to create reduction in dislocation densities.

* * * * *